United States Patent [19]

Nakagawa

[11] Patent Number: 4,586,070
[45] Date of Patent: Apr. 29, 1986

[54] THYRISTOR WITH ABRUPT ANODE EMITTER JUNCTION

[75] Inventor: Tsutomu Nakagawa, Itami, Japan

[73] Assignee: Mitsubishi Denki Kabushiki Kaisha, Tokyo, Japan

[21] Appl. No.: 707,549

[22] Filed: Mar. 5, 1985

Related U.S. Application Data

[63] Continuation of Ser. No. 498,687, Jun. 1, 1983, abandoned, which is a continuation of Ser. No. 175,865, Aug. 6, 1980, abandoned.

[30] Foreign Application Priority Data

Aug. 7, 1979 [JP] Japan ................................ 54-100988

[51] Int. Cl.$^4$ ........................................... H01L 29/74
[52] U.S. Cl. ........................................ 357/38; 357/89; 357/90
[58] Field of Search ............................ 357/38, 89, 90

[56] References Cited

U.S. PATENT DOCUMENTS

| | | | |
|---|---|---|---|
| 3,249,831 | 5/1966 | New et al. | 357/90 |
| 3,361,943 | 1/1968 | Knott et al. | 357/38 |
| 3,370,209 | 2/1968 | Davis et al. | 357/38 |
| 3,428,870 | 2/1969 | Davis | 357/38 |
| 3,437,886 | 4/1969 | Edquist et al. | 357/38 |
| 3,449,649 | 6/1969 | Irmler et al. | 357/38 |
| 3,538,401 | 11/1970 | Chu | 357/38 |
| 3,575,644 | 4/1971 | Huth et al. | 357/90 |
| 4,402,001 | 8/1983 | Momma et al. | 357/90 |

FOREIGN PATENT DOCUMENTS

| | | | |
|---|---|---|---|
| 2051400 | 3/1972 | Fed. Rep. of Germany | 357/38 |
| 2422395 | 11/1975 | Fed. Rep. of Germany | 357/38 |

Primary Examiner—Joseph E. Clawson, Jr.
Attorney, Agent, or Firm—Oblon, Fisher, Spivak, McClelland & Maier

[57] ABSTRACT

A thyristor has a pnpn four layer structure having a positive bevel in an anode side and a negative bevel in a cathode side. A ramp of a distribution of impurity concentrations in an anode-emitter layer near an anode-emitter junction is greater than a ramp of a distribution of impurity concentrations in a cathode-base layer near a central junction so as to improve the trade-off relation between the forward voltage drop and the withstand voltage.

3 Claims, 4 Drawing Figures

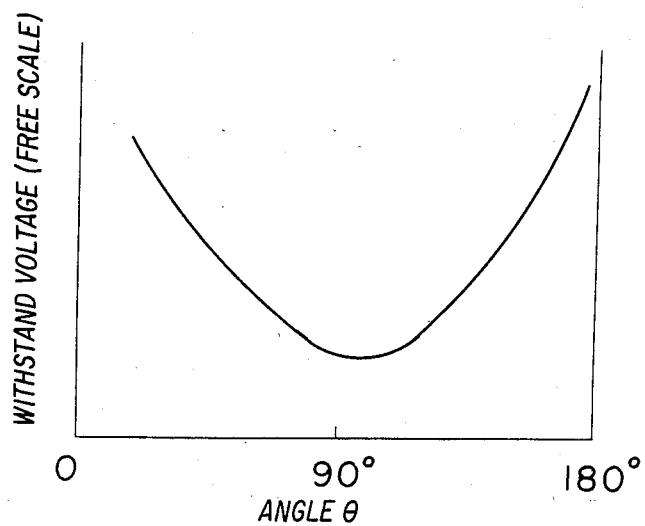
F I G. 1

THYRISTOR WITH ABRUPT ANODE EMITTER JUNCTION

This application is a continuation of application Ser. No. 498,687, filed June 1, 1983, abandoned, which is a continuation of application Ser. No. 175,865, filed Aug. 6, 1980, abandoned.

BACKGROUND OF THE INVENTION

1. Field of the Invention

The present invention relates to a distribution of diffused impurity concentration of a thyristor.

2. Background of the Invention

A power semiconductor device having pn-junction such as a power thyristor provides a ramp formation for processing a semiconductor substrate to increase a surface area of a peripheral part of the semiconductor substrate and then chemically etching a broken layer formed by the processing, in order to protect a pn-junction exposed at the peripheral part of the semiconductor substrate and to give a desired withstand voltage. The ramp formation is performed for purposes of decreasing a field of the surface from a field of the inner part of the semi-conductor substrate by increasing a creeping distance of insulation near the pn-junction exposed at the surface and preventing the decrease of the withstand voltage. The ramp formation is classified into two methods of a negative bevel for providing greater than 90 degree of an angle $\theta$ between the pn-junction and the ramp surface and a positive bevel for providing less than 90 degree of the angle $\theta$.

FIG. 1 shows the relation of the angle $\theta$ and the withstand voltage.

As shown in FIG. 1, the angle $\theta$ is 45 to 60 degree in the positive bevel and about 2 to 3 degree in the negative bevel whereby the effective area of the semiconductor substrate is maintained and the decrease of the withstand voltage by a punch-through is prevented and the desired dv/dt capability is maintained to obtain high withstand voltage.

In the thyristor having the distribution of diffused impurity concentration shown in FIG. 2, the withstand voltage of the negative bevel is usually lower than that of the positive bevel for about 20 to 30%.

In FIG. 2, the reference ($E_1$) designates an n type first emitter layer; ($B_1$) designates a p-first base layer; ($B_2$) designates an n-second base layer; ($E_2$) designates a p-second emitter layer; ($J_1$) designates a pn-junction formed by the second emitter layer ($E_2$) and the second base layer ($B_2$); ($J_2$) designates a pn-junction formed by the second base layer ($B_2$) and the first base layer ($B_1$); ($J_3$) designates a pn-junction formed by the first base layer ($B_1$) and the first emitter layer ($E_1$). A width ($W_2$) of the second emitter layer ($E_2$) having the distribution of the impurity concentrations lower than that of the first base layer ($B_1$) near the junction ($J_3$), is larger than the width ($W_1$) of the first base layer ($B_1$).

For example, when the junction ($J_2$) is in the negative bevel of 2.5 degree and the junction ($J_1$) is in the positive bevel of 60 degree in the thyristor using the semiconductor substrate having a specific resistance of 35 $\Omega$-cm, the withstand voltage of the junction ($J_2$) is 1,000 V and the withstand voltage of the junction ($J_1$) is 1,600 V. The withstand voltage of the junction ($J_2$) is remarkable lower than that of the junction ($J_1$). That is, the withstand voltage of the thyristor is 1,000 V.

In order to overcome these disadvantages, the structure having the distribution of diffused impurity concentrations shown in FIG. 3 is used for a power thyristor. The first base layer ($B_1$) and the second emitter layer ($E_2$) are formed in a structure comprising a region A having a small ramp of the impurity concentrations and a region B having a large ramp of the impurity concentrations by a double diffusion method.

When the junction ($J_2$) is reverse-biased, a depletion layer is expanded to the first base layer ($B_1$) and a field intensity is weakened to increase the withstand voltage and a punch-through in the first base layer ($B_1$) is prevented to provide a desired dv/dt capability. This structure is mainly used.

When a semiconductor substrate having a specific resistance of 35 $\Omega$-cm used and the junction ($J_2$) is in the negative bevel and the junction ($J_1$) is in the positive bevel in the structure of the thyristor, the withstand voltage of the junction ($J_2$) is 1,350 V and the withstand voltage of the junction ($J_1$) is 1,600 V. Although the withstand voltage of the junction ($J_1$) is not increased the withstand voltage of the thyristor is 1,350 V. The increase of the withstand voltage is remarkably high in comparison with the thyristor having the distribution of diffused impurity concentrations shown in FIG. 2.

On the other hand, it is well known that a forward voltage drop of a thyristor is increased depending upon an increase of a width of the second base layer ($B_2$).

In a case of a pnpn structure, the width and the specific resistance of the second base layer ($B_2$) are decided depending upon the withstand voltage of the thyristor. The width of the second base layer ($B_2$) is larger and the specific resistance is larger depending upon the increase of the withstand voltage of the thyristor. Thus, the forward voltage drop is higher depending upon the increase of the withstand voltage.

A power consumption of the semiconductor device per area is limited depending upon a heat resistance of the semiconductor device. The increase of the forward voltage drop limits a permissible current capacity. In order to increase the capacity, the forward voltage drop should be lowered.

A turn-on current density for deciding the permissible current capacity of the thyristor is in a range of about 100 to 300 A/cm$^2$. When the current having the turn-on current density of about 100 to 300 A/cm$^2$ is fed to a thyristor of a pnpn structure having an n type first emitter layer ($E_1$), it is well known that the electron density doped from the first emitter layer ($E_1$) into the first base layer ($B_1$) is in a range of $10^{17}$ to $10^{18}$/cm$^3$. Therefore, when the current density is greater than 100 A/cm$^2$, the pnpn type thyristor has substantially the same structure as the pn structure. This is also considered in the second emitter layer ($E_2$) at the junction ($J_1$). When the current density is greater than 100 A/cm$^2$, the first base layer ($B_1$) and the second emitter layer ($E_2$) which have the impurity concentration of $10^{17}$ to $10^{18}$/cm$^3$ have the same structure as that of the second base layer ($B_2$). When the junction ($J_2$) is in the negative bevel and the junction ($J_1$) is in the positive bevel in the thyristor having the distribution of diffused impurity concentrations shown in FIG. 3, the withstand voltage is increased but the forward voltage drop is disadvantageously increased.

SUMMARY OF THE INVENTION

It is an object of the present invention to overcome the abovementioned disadvantage and to provide a thyristor which has a junction (J₂) in the negative bevel and a junction (J₁) in the positive bevel and has low forward voltage drop without lowering a withstand voltage of the junction (J₂).

The foregoing and other objects of the present invention have been attained by providing a thyristor which comprises a first conductive type first emitter layer, a second conductive type first base layer, a first conductive type second base layer and a second conductive type second emitter layer in adjacent order between one main surface and the other main surface of a semiconductor substrate, wherein an exposed surface of the first junction formed by said first base layer and said second base layer on the side surface of said semiconductor substrate is in negative bevel and an exposed surface of the second junction formed by said second base layer and said second emitter layer is in positive bevel. An improvement characterized in that a thickness of said second emitter layer, having a distribution of impurity concentration less than an impurity concentration of said first base layer near a third junction formed by said first emitter layer and said first base layer, is smaller than a thickness of said first base layer.

BRIEF DESCRIPTION OF THE DRAWINGS

FIG. 1 is a characteristic diagram showing the relation of a ramp angle of an exposed surface of pn-junction and a withstand voltage;

DETAILED DESCRIPTION OF THE INVENTION

Figure 4:
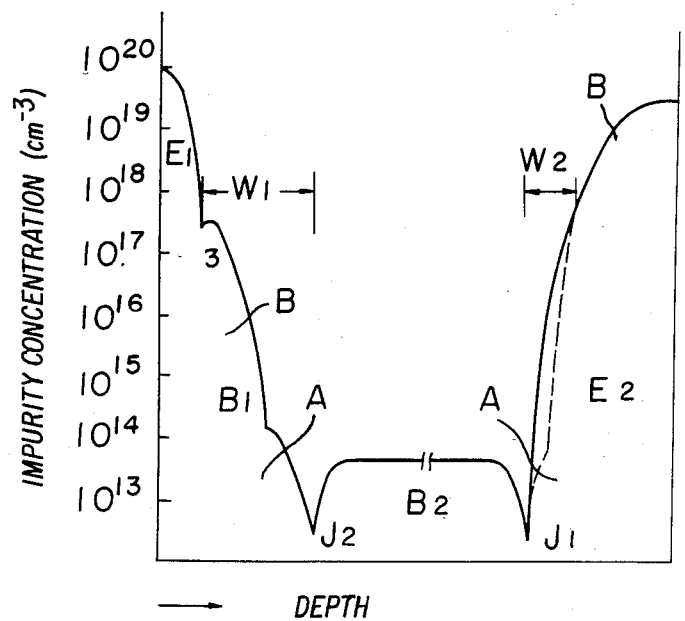
FIG. 4 is a diagram showing a distribution of diffused impurity concentrations of one embodiment of the thyristor of the present invention.

FIG. 4 shows the distribution of diffused impurity concentrations of the thyristor of the present invention. The present invention will be illustrated referring to FIG. 4.

In accordance with the present invention, the first base layer (B₁) is formed by the high resistance p type region A having a small ramp of distribution of diffused impurity concentrations as the first base layer (B₁) near the junction (J₂) in the negative bevel and the low resistance p type region B having a large ramp of distribution of diffused impurity concentrations which prevents the punch-through in the case of the application of the reverse bias voltage to the junction (J₂), to give a desired dv/dt capability and $I_{gt}$. The high resistance region A of the second emitter layer (E₂) is decreased by increasing the ramp of the distribution of diffused impurity concentrations of the second emitter layer (E₂) near the junction (J₁) in the positive bevel. The width (W₂) of the second emitter layer (E₂) having the diffused impurity concentration of less than $10^{17}$ to $10^{18}/cm^3$ is smaller than the width (W₁) of the first base layer (B₁) having the diffused impurity concentration of less than $10^{17}$ to $10^{18}/cm^3$. In the thyristor having such structure, when the current density is greater than 100 A/cm², the width (W₂) of the region having the diffused impurity concentration of less than $10^{17}$ to $10^{18}/cm^3$ in the second emitter layer near the junction (J₁) is smaller. The increase of the width of the base layer in the second emitter layer (E₂) is small. The effective width of the base layer is shortened and the forward voltage drop is lower than that of the conventional thyristor.

The effect of the present invention will be illustrated by one example.

Figure 2:
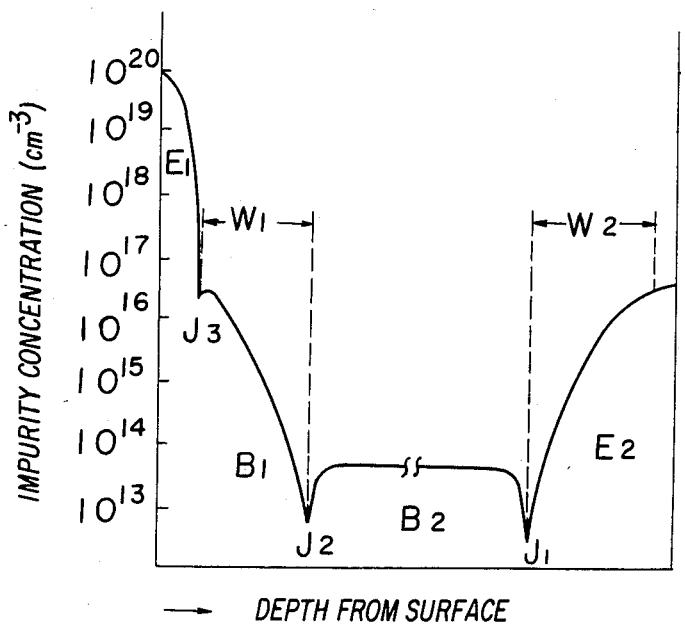
FIGS. 2 and 3 are diagrams showing each distribution of diffused impurity concentrations of the conventional thyristor.
Figure 3:
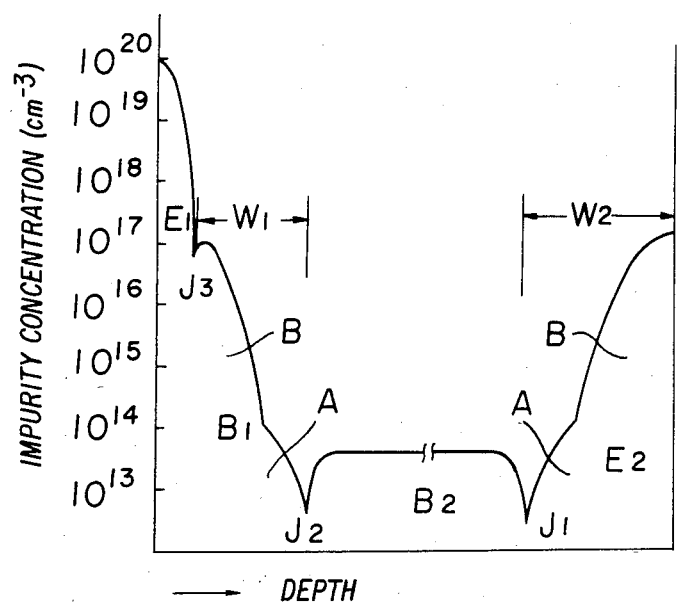

A silicon wafer having a diameter of 40 φ and a specific resistance of 35 Ω-cm is used to prepare a device having a turn-off time of 20 μS and having the structure shown in FIG. 3 which has 20μm for the width of the first emitter layer (E₁), 40 μm for the width of the low resistant region having less than $10^{17}$ to $10^{18}/cm^3$ for the diffused impurity concentration in the first base layer (B₁) and 30 μm of the width of the high resistant region except the low resistant region, 170 μm of the width of the second base layer (B₂), 30 μm for the width of the high resistant region of the second emitter layer (E₂) and 60 μm for the width of the low resistant region having less than $10^{17}$ to $10^{18}/cm^3$ for the diffused impurity concentration except the high resistant region. The device has 2.2 V for the forward voltage drop in the current of 1,200 A and 1,350 V for the withstand voltage of the junction (J₂) and 1,600 V for the withstand voltage of the junction (J₁).

On the other hand, the silicon wafer having the diameter of 40 φ and the specific resistance of 35 Ω-cm which the same as that of the example is used to prepare a device having the turn-off time of 20 μS and having the structure of the present invention, which has 20 μm for the width of the first emitter layer (E₁), 40 μm for the width of the low resistant region having less than $10^{17}$ to $10^{18}/cm^3$ for the diffused impurity concentration in the first base layer (B₁), 30 μm for the width of the high resistance region except the low resistant region, 170 μm for the width of the second base layer (B₂), 30 μm for the width of the high resistance region of the second emitter layer (E₂) having less than $10^{18}/cm^3$ for the diffused impurity concentration and 20 μm for the width of the low resistant region having more than $10^{18}/cm^3$ for the diffused impurity concentration. The device has 1,350 V for the withstand voltage of the junction (J₂) and 1,600 V for the withstand voltage of the junction (J₁) but has low forward voltage drop of 1.6 V for a current of 1200 A.

The present invention is remarkably effective for lowering the forward voltage drop, without any adverse effect ot the other characteristics especially the withstand voltage.

The main object of the present invention is to provide a structure shortening the width of the base layer which increases the effective width during passing of large current without any decrease in the withstand voltage.

The main object of the present invention can be attained by providing the structure having the distribution of diffused impurity concentrations wherein the width of the second emitter layer from the junction (J₁) base layer to the region having the diffused impurity concentration of $10^{17}$ to $10^{18}/cm^3$ is smaller than the width of the first base layer from the junction (J₂) to the region having the diffused impurity concentration of $10^{17}$ to $10^{18}/cm^3$ in the thyristor having the junction (J₂) in the negative bevel and the junction (J₁) in the positive bevel.

I claim:

1. In a thyristor which comprises a first conductive type first emitter layer, a second conductive type first base layer, a first conductive type second base layer and a second conductive type second emitter layer in adjacent order between one main surface and the other main surface of a semiconductor substrate, wherein an exposed surface of a first junction formed by said second emitter layer and said second base layer on the side surface of said semiconductor substrate is in positive bevel and an exposed surface of a second junction formed by said first base layer and said second base layer is in negative bevel, an improvement wherein said second emitter layer has a first portion extending from said first junction toward said other main surface which has a distribution of impurity concentration less than an impurity concentration of said first base layer near a third junction formed by said first emitter layer and said first base layer, wherein said first portion of said second emitter layer has a thickness defined by the distance from said first junction to the depth at which said second emitter layer has an impurity concentration equal to the impurity concentration of said first base layer near said junction and wherein said thickness is smaller than the thickness of said first base layer and wherein said first base layer has two different impurity concentration profiles formed by double diffusion, and whereby a curve of the impurity concentration of said thyristor is such that the slope of the distribution of impurity concentrations of said first base layer near said second junction is smaller than the slope of the distribution of impurity concentrations of said second emitter layer near said first junction.

2. The thyristor according to claim 1 wherein said first conductive type is n type and said second conductive type is p type.

3. The thyristor according to claim 1 wherein the impurity concentration in said first base layer near said third junction is in a range of $10^{17}$ to $10^{18}/cm^3$.

* * * * *